(12) United States Patent
Chung et al.

(10) Patent No.: US 9,353,441 B2
(45) Date of Patent: May 31, 2016

(54) HEATING/COOLING PEDESTAL FOR SEMICONDUCTOR-PROCESSING APPARATUS

(71) Applicant: ASM IP Holding B.V., Almere (NL)

(72) Inventors: Hsiao Pei Chung, Hachioji (JP); Hirofumi Arai, Sagamihara (JP); Dai Ishikawa, Ome (JP)

(73) Assignee: ASM IP Holding B.V., Almere (NL)

( * ) Notice: Subject to any disclaimer, the term of this patent is extended or adjusted under 35 U.S.C. 154(b) by 665 days.

(21) Appl. No.: 13/646,403

(22) Filed: Oct. 5, 2012

(65) Prior Publication Data

US 2014/0096716 A1    Apr. 10, 2014

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *C23C 16/458* | (2006.01) |
| *H01L 21/67* | (2006.01) |
| *H01J 37/32* | (2006.01) |
| *F27D 5/00* | (2006.01) |

(52) U.S. Cl.
CPC .......... *C23C 16/4586* (2013.01); *F27D 5/0037* (2013.01); *H01J 37/32724* (2013.01); *H01L 21/67109* (2013.01)

(58) Field of Classification Search
USPC ................. 118/728–732; 156/345.51–345.55
See application file for complete search history.

(56) References Cited

U.S. PATENT DOCUMENTS

| | | | | |
|---|---|---|---|---|
| 5,382,311 | A * | 1/1995 | Ishikawa et al. .......... | 156/345.54 |
| 6,499,533 | B2 * | 12/2002 | Yamada ....................... | 165/80.1 |
| 6,740,853 | B1 * | 5/2004 | Johnson et al. ............ | 219/444.1 |
| 6,951,587 | B1 | 10/2005 | Narushima | |
| 7,235,137 | B2 * | 6/2007 | Kitayama et al. ............. | 118/724 |
| 7,327,948 | B1 | 2/2008 | Shrinivasan | |
| 2004/0212947 | A1 * | 10/2004 | Nguyen ............ | H01L 21/67109 361/234 |
| 2007/0175393 | A1 * | 8/2007 | Nishimura et al. ........... | 118/715 |
| 2007/0224777 | A1 * | 9/2007 | Hamelin ....................... | 438/457 |
| 2008/0299326 | A1 | 12/2008 | Fukazawa | |

* cited by examiner

*Primary Examiner* — Karla Moore
*Assistant Examiner* — Tiffany Nuckols
(74) *Attorney, Agent, or Firm* — Snell & Wilmer LLP

(57) ABSTRACT

A pedestal for supporting a substrate includes: a heating plate for heating the substrate; an upper cooling plate for cooling the substrate, installed on the heating plate and provided with an upper fluid path for passing a cooling fluid therethrough; and an lower cooling plate for cooling the substrate, installed under the heating plate and including a lower fluid path for passing a cooling fluid therethrough.

17 Claims, 7 Drawing Sheets

HEATING/COOLING PEDESTAL FOR SEMICONDUCTOR-PROCESSING APPARATUS

BACKGROUND

1. Field of the Invention

The present invention generally relates to a pedestal for supporting a substrate, particularly to a heating/cooling pedestal for semiconductor-processing apparatus.

2. Description of the Related Art

During a process of deposition by plasma enhanced chemical vapor deposition (PECVD) or a process of curing by UV irradiation, the temperature of a substrate increases due to the chemical reaction inside a chamber. However, this temperature increase causes a thermal budget problem and also affects film quality. Therefore, the process conditions are required to be set in narrow ranges to inhibit unwanted increases of the substrate temperature.

In order to suppress increases of the substrate temperature, removing excess heat is necessary. There are several methods reported to control heat transfer in heat transfer assemblies such as a pedestal for supporting a substrate including both a heating element and a cooling element which removes excess heat by circulating a cooling medium such as a gaseous or liquid coolant inside the pedestal or between the substrate and the pedestal (e.g., U.S. Pat. No. 7,327,948, U.S. Pat. No. 6,951,587). When the substrate temperature increases beyond a set range during processes, the heating element is turned off, and the cooling element is activated to remove excess heat, thereby controlling the temperature.

However, while the coolant is supplied from the supply side and returned from the return side of the cooling element to absorb excess heat, the temperature of the coolant itself increases. As a result, a great temperature difference in the circulating coolant occurs between the supply side and the return side of the cooling element, wherein the temperature at the return side is significantly higher than that at the supply side. Since the reverse side of the substrate is required to be in contact with or close to the cooling element for effective and stable heat transfer between the substrate and the cooling element and for realizing fine temperature tuning, the temperature of the substrate varies according to the temperature variation of the cooling element, and thus, it becomes difficult to control an in-plane temperature gradient and keep the in-plane temperature uniform. Further, when the cooling element is disposed close to the substrate in order to increase heat transfer, a great temperature difference occurs inside the pedestal, thereby creating a localized thermal expansion difference and causing deformation and damage to the pedestal.

Any discussion of problems and solutions involved in the related art has been included in this disclosure solely for the purposes of providing a context for the present invention, and should not be taken as an admission that any or all of the discussion were known at the time the invention was made.

SUMMARY

Some embodiments provide a pedestal for supporting a substrate, comprising: (i) a heating plate for heating the substrate; (ii) an upper cooling plate for cooling the substrate, installed on the heating plate and provided with an upper fluid path for passing a cooling fluid therethrough; and (iii) a lower cooling plate for cooling the substrate, installed under the heating plate and including a lower fluid path for passing a cooling fluid therethrough. By disposing two cooling plates sandwiching a heating plate, temperature difference inside the pedestal and in the upper surface of the pedestal, and deformation of the heating plate can effectively be alleviated.

In some embodiments, the upper fluid path is spirally arranged in a clockwise or counterclockwise direction, and the lower fluid path is spirally arranged in a reverse direction. By reversing the winding directions of the upper and lower fluid paths, temperature difference in the upper surface of the pedestal can further be alleviated. In some embodiments, the upper fluid path and the lower fluid path are connected in parallel, rather than being connected in series. In some embodiments, the upper fluid path and the lower fluid path have substantially the same length and are arranged substantially in reflection symmetry.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
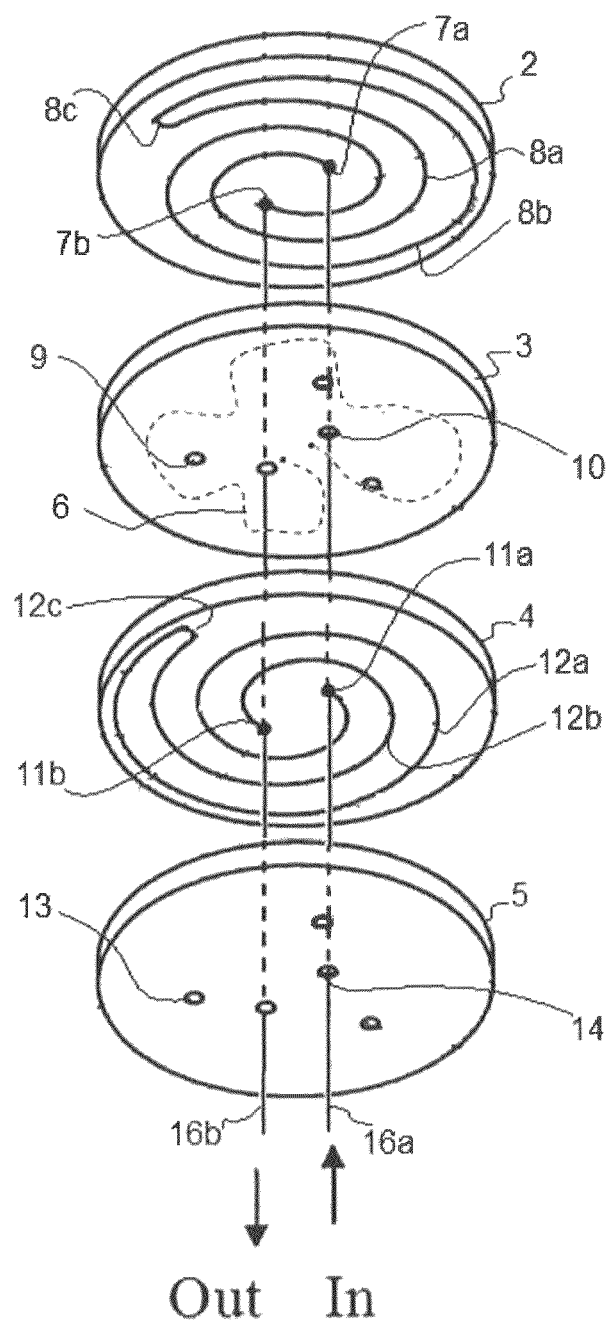
FIG. 1 is a schematic exploded view of a heating/cooling pedestal as viewed from below according to an embodiment of the present invention.

In this disclosure, "a" in front of a term refers to a species included in the term or a genus including multiple species included in the term. Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

Embodiments will be explained with respect to preferred embodiments which are not intended to limit the present invention.

As described above, the disclosed embodiments include a pedestal for supporting a substrate, comprising: (i) a heating plate for heating the substrate; (ii) an upper cooling plate for cooling the substrate, installed on the heating plate and provided with an upper fluid path for passing a cooling fluid therethrough; and (iii) a lower cooling plate for cooling the substrate, installed under the heating plate and including a lower fluid path for passing a cooling fluid therethrough. Typically, each of the upper fluid path and the lower fluid path is constituted by a single fluid path on a horizontal plane. Alternatively, each of the upper fluid path and the lower fluid path includes an additional fluid path or paths on the same horizontal plane or on a different horizontal plane.

In some embodiments, the upper fluid path is constituted by an upper fluid inlet port, an upper fluid outlet port disposed in a vicinity of the upper fluid inlet port, a turnaround point, an out-bound path extending from the upper fluid inlet port to the turnaround point, and an in-bound path extending from the turnaround point to the upper fluid outlet port along the out-bound path, and the lower fluid path is constituted by a lower fluid inlet port, a lower fluid outlet port in a vicinity of the lower fluid inlet port, a turnaround point, an out-bound path extending from the lower fluid inlet port to the turnaround point, and an in-bound path extending from the turnaround point to the lower fluid outlet port along the out-bound path. When the upper/lower fluid outlet port is disposed in a vicinity of the upper/lower fluid inlet port, construction of the pedestal is easy, as compared with, e.g., the case where the upper/lower fluid outlet port is disposed near the center whereas the upper/lower fluid inlet port is disposed near the outer periphery of the pedestal, or the case where the upper/lower fluid outlet port and the upper/lower fluid inlet port are disposed near the outer peripheries on opposite sides, although these embodiments need not be excluded as alternatives. When the upper/lower fluid outlet port and the upper/lower fluid inlet port are disposed in a vicinity of each other, the upper/lower fluid path can be laid out in many configurations. For example, the upper/lower fluid path starts from a point near the center, winds around the center, ends at a point near the outer periphery, and returns straight to the center. However, preferably, the upper/lower fluid path has an out-bound path, a turnaround point, and an in-bound path, wherein the out-bound path and the in-bound path run alongside each other, thereby rendering the temperature distribution more even.

In some embodiments, the out-bound path and the in-bound path of the upper fluid path are disposed substantially in parallel with each other as viewed from above, and the out-bound path and the in-bound path of the lower fluid path are disposed substantially in parallel with each other as viewed from above. In this disclosure, "substantially in parallel" may refer to "in parallel for the most part" (e.g., at least about 70%, about 80%, about 90% or the like in length) and/or "nearly in parallel" (e.g., the distance between the two paths is changed by less than about 20%, about 10%, or the like). For example, when the pedestal has through holes for lift pins, the fluid path may meander in order to avoid the through holes, or the fluid path may be bent at about a right angle in order to adjust the pressure in the fluid path to balance the parallel flows of the upper fluid path and the lower fluid path.

In some embodiments, the out-bound path and the in-bound path of the upper fluid path wind spirally in a first direction around the center of the upper cooling plate as viewed from above, and the out-bound path and the in-bound path of the lower fluid path wind spirally in a second direction opposite to the first direction around the center of the lower cooling plate as viewed from above. When the winding directions of the upper fluid path and the lower fluid path are opposite, temperature distribution can effectively be minimized. In some embodiments, one of the upper and lower fluid paths starts from the center, outwardly winds around the center, reaches a turnaround point near the outer periphery, inwardly winds, and ends at the center, whereas the other of the upper and lower fluid paths starts from a point near the outer periphery, inwardly winds around the center, reaches a turnaround near the center, outwardly winds, and ends near the outer periphery.

In some embodiments, the out-bound path and the in-bound path of the upper fluid path wind spirally in the first direction at least one time around the center of the upper cooling plate as viewed from above, and the out-bound path and the in-bound path of the lower fluid path wind spirally in the second direction at least one time around the center of the lower cooling plate as viewed from above. In some embodiments, the number of winds is more than one, at least about 1.5, or about 2.0, about 2.5, or the like. In order to reduce an in-plane temperature gradient, the number of winds may be about two.

In some embodiments, the upper fluid path and the lower fluid path are connected via the upper and lower fluid inlet ports connected to each other and via the upper and lower outlet ports connected to each other, so that a fluid can pass through the upper and lower fluid paths in parallel. When the fluid passes through the upper and lower fluid paths in parallel, rather than passing through the paths in series, cooling can be accomplished more efficiently. When the fluid passes through the paths in series, the temperature difference between the upper and lower cooling plates becomes significant, thereby lowering effect on alleviation of thermal expansion difference in the pedestal, although such a configuration may be used an alternative embodiment.

In some embodiments, the upper fluid inlet and outlet ports are located in a vicinity of the center of the upper cooling plate, and the lower fluid inlet and outlet ports are located in a vicinity of the center of the lower cooling plate. When a shaft of the pedestal is located in the center of the pedestal, the upper/lower fluid inlet/outlet ports are disposed preferably near the center so that an inflow line for supplying a coolant to the cooling plates and an outflow line for discharging the coolant from the cooling plates can be located inside the shaft. Alternatively, a shaft of the pedestal can be located near the outer periphery when the pedestal is light-weight, and then, the upper/lower fluid inlet/outlet ports can be located near the outer periphery and connected to the inflow and outflow lines disposed inside the shaft. Alternatively, multiple shafts can be used for the pedestal where the inflow and outflow lines are individually accommodated inside the shaft.

In some embodiments, the upper fluid path and the lower fluid path have substantially the same length and/or are arranged substantially in reflection symmetry. When the upper fluid path and the lower fluid path have substantially the same length, the pressure in each path can be equalized, thereby equalizing the flow in the upper fluid path and the lower fluid path. In this disclosure, "substantially the same" may refer to an immaterial difference or a difference so recognized by a skilled artisan such as those of less than about 10%, less than about 5% or the like in some embodiments. Alternatively, the length of the upper and lower fluid paths are different in embodiments where doing so can further alleviate temperature difference. When the wind directions are different in the upper and lower fluid paths, preferably, the upper fluid path and the lower fluid path are arranged substantially in reflection symmetry. In this disclosure, "substantially in reflection symmetry" may refer to "in reflection symmetry for the most of parts" (e.g., at least about 70%, about 80%, about 90% or the like in length) and/or "nearly in reflection symmetry" (e.g., the difference between the two paths is less than about 20%, about 10%, or the like relative to the length of the paths). Alternatively, the configurations of the upper and lower fluid paths are not in any symmetry in embodiments where doing so can further alleviate temperature difference.

In some embodiments, the lower fluid path has a substantially or nearly right-angled first and second bent portions as viewed from above in a vicinity of the lower fluid inlet port, said first bent portion being closer to the lower fluid inlet port than is the second bent portion, and the upper fluid inlet port is connected vertically to the first bent portion; and the lower fluid path has a substantially or nearly right-angled third and fourth bent portions as viewed from above in a vicinity of the lower fluid outlet port, said fourth bent portion being closer to the lower fluid outlet port than is the third bent portion, and the upper fluid outlet port is connected vertically to the fourth bent portion, so that fluid pressure in the upper fluid path and that in the lower fluid path are substantially the same. In the above, the fluid is supplied to the lower fluid path (which is laid out horizontally) from a vertical inflow line accommodated inside a center shaft, and thus, the fluid enters into the lower fluid path via a bent portion at the lower fluid inlet port. The first bent portion downstream of the lower fluid inlet port is located where the lower fluid path is branched into two paths both nearly at a right angle (one is a vertical path connected to the upper fluid path; the other is a horizontally bent portion of the lower fluid path). The lower fluid path is horizontally bent one more time at the second bent portion downstream of the first bent portion, before a wound portion of the lower fluid path starts. Thus, the fluid enters from the inflow line into the wound portion of the lower fluid path after passing through three vent portions (the bent portion at the lower fluid inlet port, the first and second bent portions). Similarly, the fluid enters from the inflow line into a wound portion of the upper fluid path after also passing through three bent portions (the bent portion at the lower fluid inlet portion, the first bent portion of the lower fluid path, and a bent portion where the vertical connecting path and the wound portion of the upper fluid path meets). When the fluid is discharged from the lower fluid path, the fluid is discharged to a vertical outflow line accommodated inside the center shaft by passing through three bent portions (the third and fourth bent portions, and a bent portion at the lower fluid outlet port). When the fluid is discharged from the upper fluid path, the fluid is discharged to the vertical outflow line accommodated inside the center shaft by also passing through three bent portions (a bent portion at the upper fluid outlet port, the fourth bent portion, and the bent portion at the lower fluid outlet port). Since the number of the bent portions passed through when entering into and being discharged from the upper and lower fluid paths is the same, the fluid pressure in the upper and lower fluid paths is substantially equivalent, thereby substantially equalizing the fluid flow in the upper and lower fluid paths. In some embodiments, the number of bends to adjust the fluid pressure can be determined by a skilled artisan based on the configurations through routine work. In the disclosure, "substantially the same", "substantially equal", or the like may refer to an immaterial difference or a difference so recognized by a skilled artisan such as those of less than 10%, less than 5%, or the like in some embodiments.

In some embodiments, the upper cooling plate, the heating plate, and the lower cooling plate are made of a metal and are soldered using a solder. In some embodiments, the upper cooling plate, the heating plate, and the lower cooling plate are made of aluminum. Alternatively, these plates can be made of stainless steel, ceramics, alloys, etc.

In some embodiments, the upper cooling plate is constituted by a metal plate with a patterned recess, and the upper fluid path is constituted by the patterned recess and a top surface of the heating plate; and the lower cooling plate includes a bottom cap and is constituted by a metal plate with a patterned recess, and the lower fluid path is constituted by the patterned recess and a top surface of the bottom cap attached to a bottom of the metal plate. By using recesses as a fluid path and using a surface of the other plate underneath as a bottom of the fluid path, the fluid path can easily, accurately, and economically be formed.

In some embodiments, the upper cooling plate has a top surface for supporting the substrate thereon, wherein the pedestal does not require any separate top plate for supporting a substrate, and a substrate can be placed directly on and in contact with the top surface of the cooling plate. Alternatively, the pedestal may use a top plate for supporting a substrate placed on top of the upper cooling plate, depending on the type of processing performed in a chamber, the configurations of the chamber, etc. For example, an electric chuck or a protective plate may be used on top of the upper cooling plate, depending on the type of reactor. In some embodiments, more than two cooling plates can be used, or one cooling plate can have two layers of fluid paths, or one cooling plate can have multiple single fluid paths on the same plane with multiple inlet and outlet ports. Alternatively, in some embodiments, only two cooling plates are used, and each cooling plate has only one layer of a single continuous fluid path.

In some embodiments, the heating plate is of any type including a conventional heating plate or any other suitable heating plates. In some embodiments, the heating plate uses a sheath heater or coil heater embedded in the heating plate.

In some embodiments, the upper cooling plate, the heating plate, and the lower cooling plate have through holes for lift pins slidable along the through holes for lifting the substrate. Typically, three lift pins are used, and the through holes for the lift pins are disposed symmetrically relative to the center of the plate.

In some embodiments, the upper fluid path and the lower fluid path are connected to a fluid supply line which supplies the cooling fluid which is a gas or gases selected from the group consisting of air, $N_2$, He, and Ar. In some embodiments, the upper fluid path and the lower fluid path are connected to a fluid supply line which supplies the cooling fluid which is a liquid or liquids selected from the group consisting of water, ethylene glycol, and fluorocarbon. In some embodiments, the lower and upper fluid paths are connected to an inflow line and an outflow line, and a fluid is supplied to the paths at, e.g., about 0 slm to about 350 slm, typically about 0 slm to about 100 slm, and the temperature of the fluid passing through the inflow line may be about 0° C. to about 500° C., typically about 0° C. to about 100° C., and the temperature of the fluid passing through the outflow line may be about 0° C. to about 500° C., typically about 15° C. to about 400° C., depending on the configurations of the fluid paths, the type of processing, etc.

In some embodiments, any one of the disclosed pedestals is adapted to be installed in a UV irradiation apparatus. In some embodiments, any one of the disclosed pedestals is adapted to be installed in a CVD or ALD apparatus including a plasma enhanced CVD or ALD. Thus, in some embodiments, a UV irradiation apparatus comprises a UV irradiation chamber in which the pedestal is installed for supporting a substrate, and a CVD or ALD apparatus comprises a CVD or ALD reaction chamber in which the pedestal is installed for supporting a substrate.

The disclosed embodiments will be further explained with reference to drawings which are not intended to limit the present invention.

FIG. 1 is a schematic exploded view of a heating/cooling pedestal as viewed from below according to an embodiment of the present invention. In this figure, the pedestal is constituted by four plates: an upper cooling plate 2, a heating plate 3, a lower cooling plate 4, and a bottom plate 5. However, this figure is a concept drawing, and the upper cooling plate 2 typically also serves as a top plate, but alternatively, a separate top plate can be placed on top of the upper cooling plate 2. The heating plate 3 is equipped with a sheath heater 6 embedded therein for heating a substrate. The sheath heater 6 can be arranged in any pattern. The upper cooling plate 2 is placed on a top of the heating plate 3 and has an upper single fluid path starting from a fluid inlet port 7*a*, outwardly extending spirally in a clockwise direction (an out-bound fluid path 8*a*), reaching a turnaround point 8*c*, inwardly extending spirally in a clockwise direction (an in-bound fluid path 8*b*), and ending at a fluid outlet port 7*b*. The fluid inlet port 7*a* is connected to an inflow line 16*a*, and the fluid outlet port 7*b* is connected to an outflow line 16*b*. The lower cooling plate 4 is placed under the heating plate 3 and has a lower single fluid path starting from a fluid inlet port 11*a*, outwardly extending spirally in a counterclockwise direction (an out-bound fluid path 12*a*), reaching a turnaround point 12*c*, inwardly extending spirally in a counterclockwise direction (an in-bound fluid path 12*b*), and ending at a fluid outlet port 11*b*. The fluid inlet port 11*a* is connected to the inflow line 16*a*, and the fluid outlet port 11*b* is connected to the outflow line 16*b*. Since the inlet port 7*a* and the inlet port 11*a* are both connected to the inflow line 16*a*, and the outlet port 7*b* and the outlet port 11*b* are both connected to the outflow line 16*b*, the fluid flows through the upper cooling plate 2 and the lower cooling plate 4 in parallel in different directions. The upper cooling plate 2, the heating plate 3, and the lower cooling plate 4 are soldered via a solder, for example. The bottom of the lower cooling plate 4 is covered by the bottom plate 5 which serves as a bottom of the lower cooling plate 4. The inflow line 16*a* and the outflow line 16*b* penetrate the heating plate 3 and the bottom plate 5 through holes 10 and 14, respectively. The upper cooling plate 2, the heating plate 3, the lower cooling plate 4, and the bottom plate 5 each have three through holes for lift pins symmetrically relative to the center (holes 9 and 13 in the heating plate 3, and the bottom plate 5, respectively). However, through holes provided in the upper and lower cooling plates 2, 4 are omitted in the figure to illustrate the single fluid paths clearly.

Figure 2:
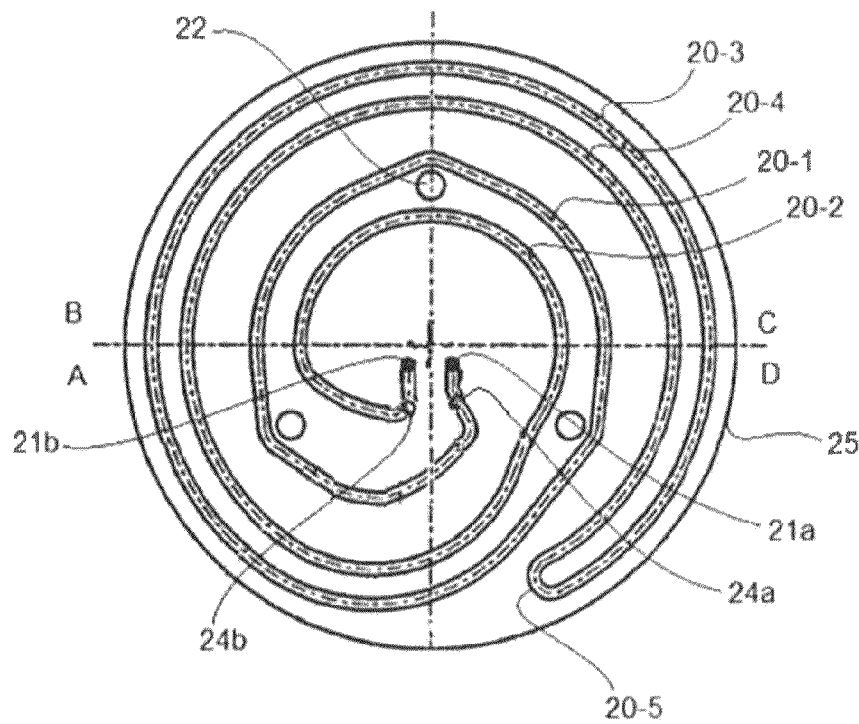
FIG. 2 is a schematic bottom view of a lower cooling plate according to an embodiment of the present invention.

FIG. 2 is a schematic bottom view of a lower cooling plate 25 according to an embodiment of the present invention. The lower cooling plate 25 has a lower single fluid path starting from a fluid inlet port 21*a*, outwardly extending spirally in a clockwise direction as viewed from below as can be seen in this figure or a counterclockwise direction as viewed from above (out-bound fluid paths 20-1, 20-3), reaching a turnaround point 20-5, inwardly extending spirally in a counterclockwise direction as viewed from below as can be seen in this figure or a clockwise direction as viewed from above (in-bound fluid paths 20-4, 20-2), and ending at a fluid outlet port 21*b*. The fluid inlet port 21*a* is connected to an inflow line and also is a bent portion where the vertical inflow line meets the horizontal fluid path of the lower cooling plate. The fluid outlet port 21*b* is connected to an outflow line. The out-bound path 20-1 and the in-bound path 20-2, and the out-bound path 20-3 and the in-bound path 20-4 are substantially or nearly in parallel. The lower single fluid path has a branch portion 24*a* at a slightly curved point before the wound portion starts. At the branch portion 24*a*, a vertical inflow line extends upward therefrom and is connected to a fluid inlet port 31*a* of an upper single fluid path. Also, the lower single fluid path has another branched portion 24*b* at a curved portion after the wound portion ends. The branched portion 24*b* is also connected to a fluid outlet port 31*b* of an upper single fluid path. The locations of the branched portions are arranged so as to adjust the fluid pressure in the lower single fluid path. The number of winds is approximately two (there are four paths in any radial direction for the most part). When the cooling plate is divided into quadrants A, B, C, and D as can be seen in this figure, the fluid inlet 21*a* is within quadrant D, the fluid outlet 21*b* is within quadrant A, and the turnaround point 20-5 is within quadrant D. The lower cooling plate has three through holes 22 for lift pins. The lower cooling plate also has six holes for fastening a bottom plate with screws or the like.

Figure 3:
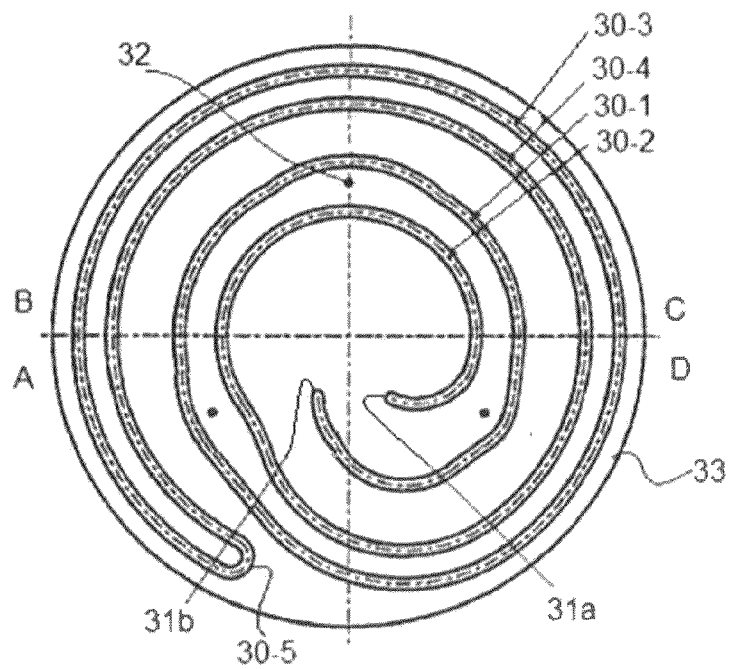
FIG. 3 is a schematic bottom view of an upper cooling plate according to an embodiment of the present invention.

FIG. 3 is a schematic bottom view of an upper cooling plate 33 according to an embodiment of the present invention. The upper cooling plate 33 has an upper single fluid path starting from a fluid inlet port 31*a*, outwardly extending spirally in a counterclockwise direction as viewed from below as can be seen in this figure or a clockwise direction as viewed from above (out-bound fluid paths 20-2, 20-4), reaching a turnaround point 30-5, inwardly extending spirally in a counterclockwise direction as viewed from below as can be seen in this figure or a clockwise direction as viewed from above (in-bound fluid paths 30-3, 30-1), and ending at a fluid outlet port 31*b*. The fluid inlet port 31*a* is connected to the branched portion 24*a* of the lower cooling plate 25, and the fluid outlet port 31*b* is connected to the branched portion 24*b* of the lower cooling plate 25. The out-bound path 30-2 and the in-bound path 30-1, and the out-bound path 30-4 and the in-bound path 30-3 are substantially in parallel. The fluid inlet port 31*a* is a bent portion where a vertical connecting path (connecting the fluid inlet port 31*a* and the bent portion 24*a*) meets the horizontal fluid path. The fluid outlet port 31*b* is connected to the branched portion 24*a* of the lower upper single fluid path. Also, the fluid outlet port 31*b* is a bent portion where a vertical connecting path (connecting the fluid outlet port 31*b* and the bent portion 24*b*) meets the horizontal fluid path. When the cooling plate is divided into quadrants A, B, C, and D as can be seen in this figure, the fluid inlet 31*a* is within quadrant D, the fluid outlet 31*b* is within quadrant A, and the turnaround point 30-5 is within quadrant A. The lower single fluid path and the upper single fluid path are arranged substantially in reflection symmetry. Thus, in-plane temperature difference can effectively be controlled. The upper cooling plate has three through holes 32 for lift pins.

Figure 9:
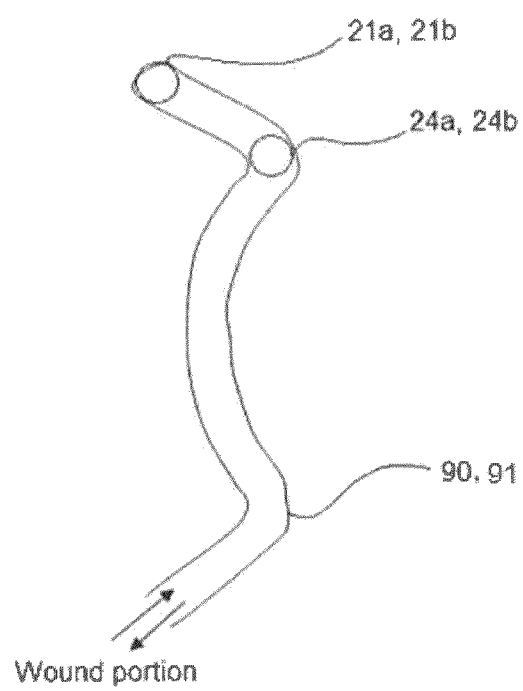
FIG. 9 is a schematic view of a lower fluid path near a branched portion according to an embodiment of the present invention.

In some embodiments, in order to divide the fluid flow at the branched portion 24a equally into the upper fluid path and the lower fluid path, they can be designed so that pressure loss in the upper fluid path and pressure loss in the lower fluid path can be substantially equal. For example, bent portions can be made in the lower fluid path downstream of the branched portion 24a connected to the inflow line and upstream of the branched portion 24b connected to the outflow line as illustrated in FIG. 9. The branched portion 24a, 24b is approximately right-angled horizontally in FIG. 9 and is also approximately right-angled vertically for connecting to the vertical connecting path. There are other bent portions 90, 91 downstream of the branched portion 24a and upstream of the branched portion 24b, respectively. The bent portions 90, 91 are each approximately right-angled horizontally in FIG. 9. Thus, there are four bent portions, 24a, 90, 91, and 24b in the lower fluid path between the inlet port 21a and the outlet port 21b, and there are four bent portions, 24a, 31a, 31b, and 24b in the upper fluid path between the inlet port 21a and the outlet port 21b. Since the number of the bent portions in the lower fluid path and that in the upper fluid path are the same, the fluid pressures in the upper and lower fluid paths can be balanced, and uniform parallel flow of the fluid in the upper and lower single fluid paths can be achieved.

Figure 4:
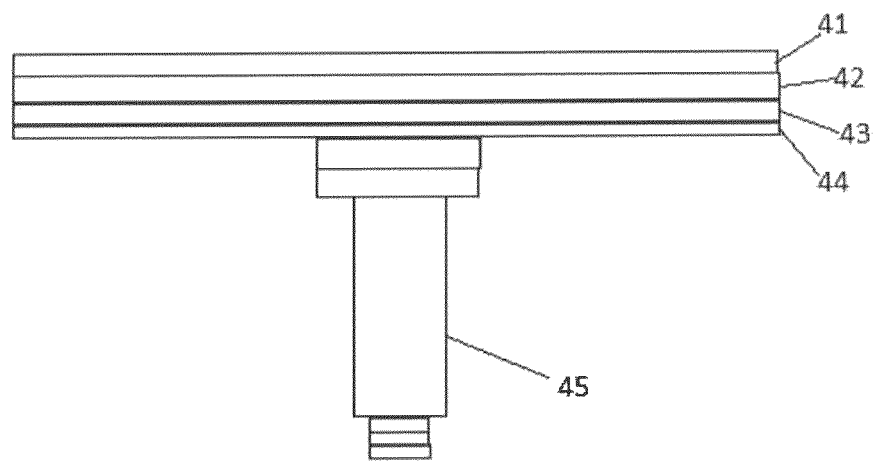
FIG. 4 is a schematic front view of a heating/cooling pedestal according to an embodiment of the present invention.
Figure 5:
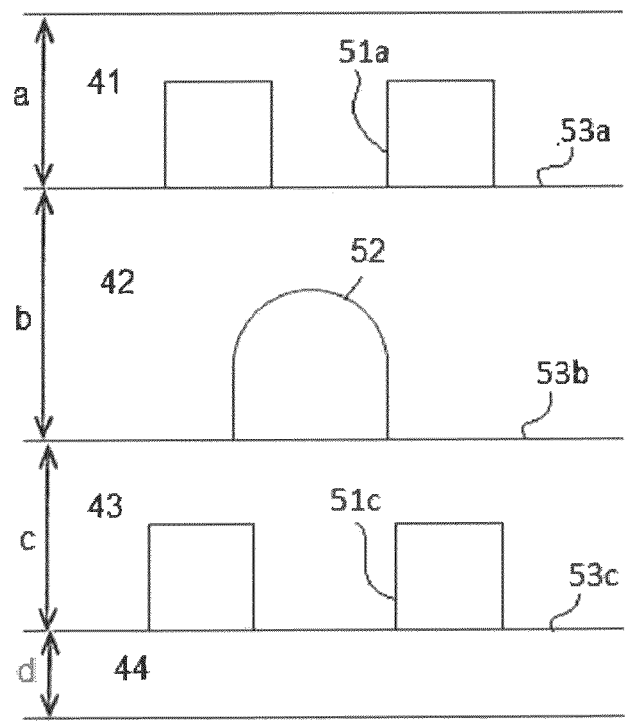
FIG. 5 is a schematic partial cross sectional view of a heating/cooling pedestal according to an embodiment of the present invention.

FIG. 4 is a schematic front view of a heating/cooling pedestal according to an embodiment of the present invention. FIG. 5 is a schematic partial cross sectional view of the heating/cooling pedestal according to an embodiment of the present invention. In this embodiment, the pedestal comprises an upper cooling plate 41, a heating plate 42, a lower cooling plate 43, a bottom plate 44, and a shaft 45. Inside the shaft 45, electric wiring, thermocouple wiring, an inflow line, an outflow line, etc. are accommodated. The upper cooling plate 41, the heating plate 42, the lower cooling plate 43, and the bottom plate 44 are soldered via solder 53a, 53b, and 53c, respectively, under high pressure, and the bottom plate 44 serves as a bottom of the lower cooling plate 43. The heating plate 42 includes a sheath heater or coil heater 52 embedded therein. The upper cooling plate 41 has patterned recesses 51a formed by mechanical processing such as stripping or grinding of an aluminum plate. Alternatively, the recesses can be formed by molding, or a cooling channel formed using a tube can be used in other embodiments. The patterned recesses 51a and the top surface of the heating plate 42 constitute an upper single fluid path. The lower cooling plate 43 has patterned recesses 51c formed by stripping or grinding an aluminum plate. The patterned recesses 51c and the top surface of the bottom plate 44 constitute a lower single fluid path.

In some embodiments, thickness a of the upper cooling plate 41 is in a range of about 5 mm to about 40 mm, typically about 5 mm to about 30 mm, thickness c of the lower cooling plate 43 is in a range of about 5 mm to about 40 mm, typically about 5 mm to about 25 mm, thickness b of the heating plate 42 is in a range of about 10 mm to about 50 mm, typically about 10 mm to about 30 mm, and thickness d of the bottom plate 44 is in a range of about 3 mm to about 20 mm, typically about 3 mm to about 10 mm. In some embodiments, the diameter of the plates is about 100 mm to about 3000 mm, typically about 100 mm to about 500 mm, depending on the size of a substrate to be processed. In some embodiments, the area of the cross section of the fluid path is about 10 mm$^2$ to about 250 mm$^2$, e.g., the size of the fluid path may be about 5 mm×about 5 mm, or about 7 mm×about 7 mm. The shape of the cross section of the fluid path may be quadrilateral, polygonal, circular, etc.

Figure 7:
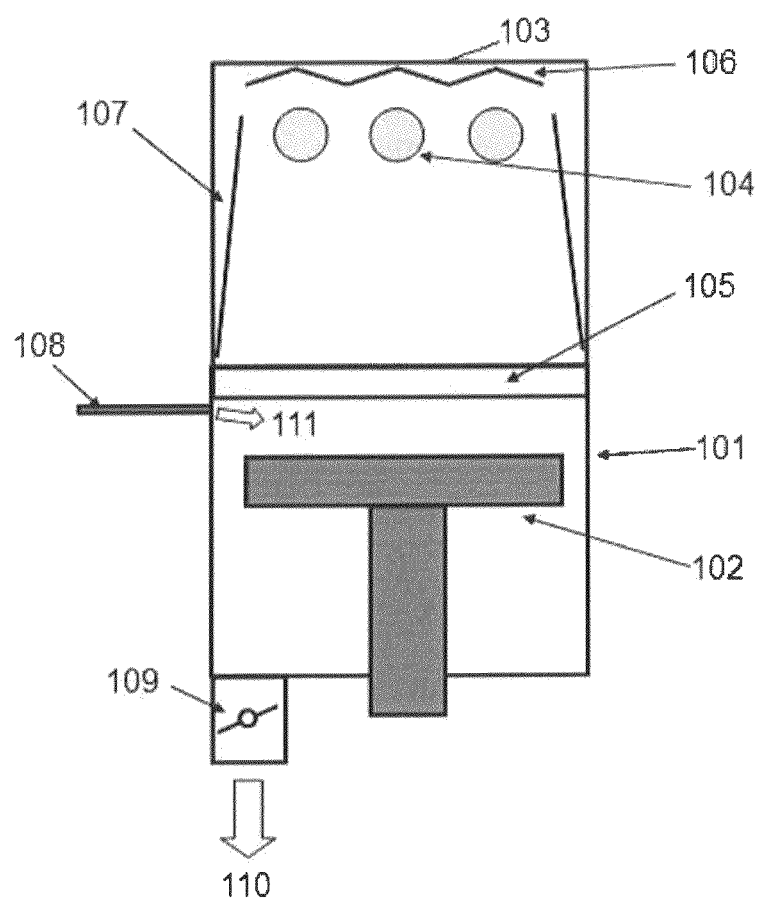
FIG. 7 is a schematic view of a UV system usable in an embodiment of the present invention.

FIG. 7 is a schematic view of a UV system usable in an embodiment of the present invention. The UV irradiation apparatus used in this example comprises a UV lamp unit 103, UV transmission glass 105, vacuum reactor 101, heating/cooling pedestal 102 which is any of the disclosed embodiments, process gas inlet tube 108, process gas inlet port 111, vacuum pump 110, and pressure control valve 109. The UV lamp unit 103 has UV mirrors 106, 107 for efficient irradiation of UV light. Note that multiple process gas inlet ports may be provided at roughly an equal pitch along the inner periphery walls of the reactor to allow gas to be introduced toward the center from the inner periphery walls of the reactor. Note that the present invention is not at all limited to the apparatus shown in this figure and any other apparatus can be used so long as it can irradiate UV light. The apparatus shown comprises a chamber that can be controlled to pressures from vacuum to around atmospheric pressure, and a UV irradiation unit provided at the top of the chamber.

Figure 8:
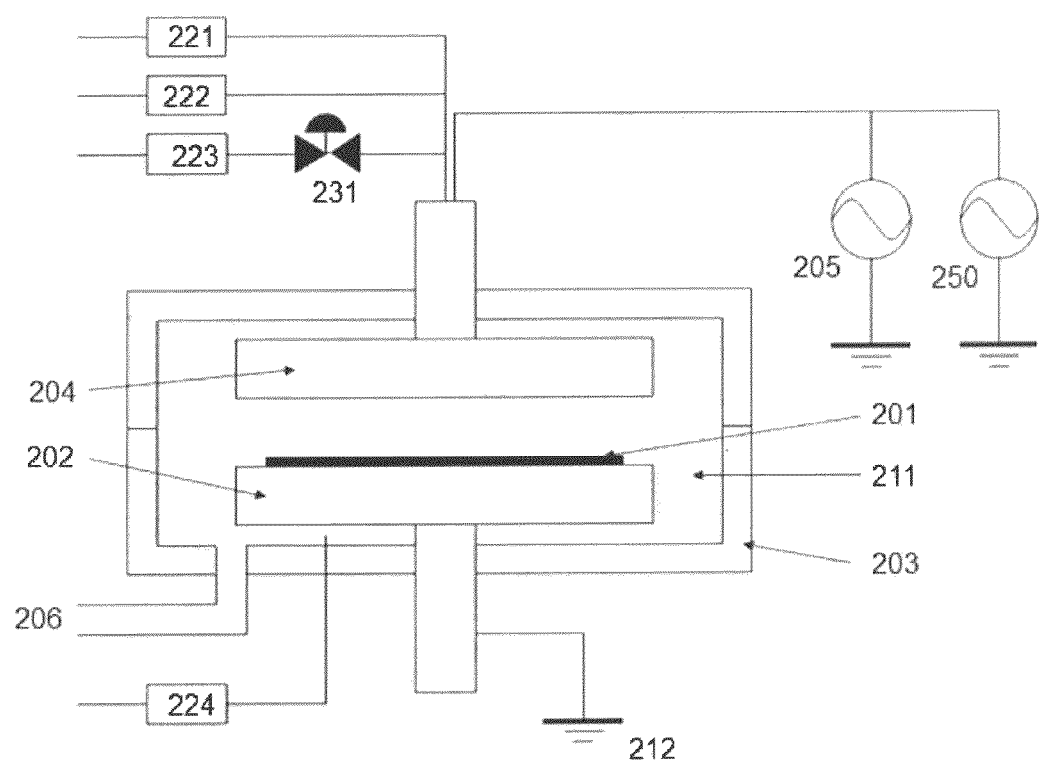
FIG. 8 is a schematic representation of a PEALD apparatus for depositing a dielectric film usable in some embodiments of the present invention.

FIG. 8 is a schematic representation of a PECVD apparatus for depositing a dielectric film usable in some embodiments of the present invention. In this example, by providing a pair of electrically conductive flat-plate electrodes 204, 202 in parallel and facing each other in the interior 211 of a reaction chamber 203, applying HRF power (13.56 MHz or 27 MHz) 205 and LRF power of 5 MHz or less (400 kHz~500 kHz) 250 to one side, and electrically grounding 212 the other side, a plasma is excited between the electrodes. A heating/cooling pedestal 202 which is any of the disclosed embodiments is provided (which also serves as the lower electrode), and a temperature of a substrate 201 placed thereon is kept constant at a given temperature. The upper electrode 204 serves as a shower plate as well, and reaction gas and rare gas are introduced into the reaction chamber 203 through a gas flow controller 223, a pulse flow control valve 231, and the shower plate. Additionally, in the reaction chamber 203, an exhaust pipe 206 is provided through which gas in the interior 211 of the reaction chamber 203 is exhausted. Additionally, the reaction chamber is provided with a seal gas flow controller 224 to introduce seal gas into the interior 211 of the reaction chamber 203 (a separation plate for separating a reaction zone and a transfer zone in the interior of the reaction chamber is omitted from this figure). For the pulse flow control valve 231, a pulse supply valve that is used for ALD can suitably be used in some embodiments.

Example

Figure 6:
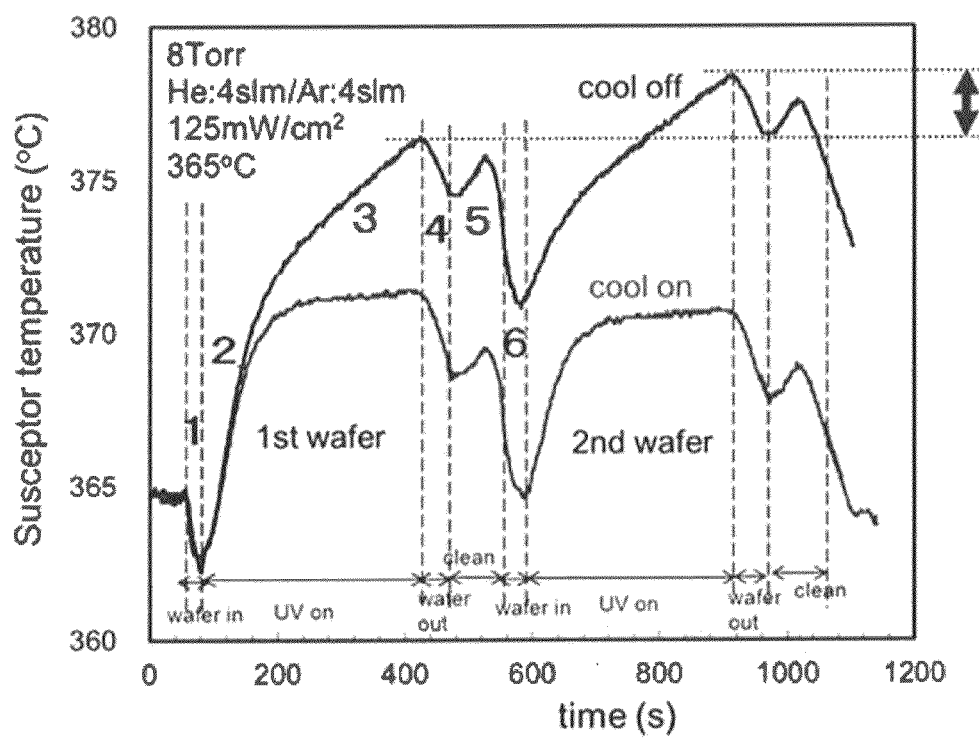
FIG. 6 is a graph showing the relationships between pedestal temperature (° C.) and time (seconds) according to an embodiment of the present invention and a comparative embodiment.

A heating/cooling pedestal ("susceptor") illustrated in FIGS. 2, 3, and 4 (aluminum, a diameter of 350 mm, a thickness a, b, c, and d of 5 mm, 11 mm, 14 mm, and 13 mm, respectively, a size of the fluid path of 5 mm×5 mm) was installed in a UV irradiation apparatus ("reactor") illustrated in FIG. 7. A first semiconductor wafer (300 mm in diameter) was placed on the pedestal and UV irradiation was initiated under the following conditions: a pressure of 8 Torr, a He flow of 4 slm, an Ar flow of 4 slm, a UV intensity of 125 mW/cm$^2$, a heater set temperature of 365° C. The process sequence was shown in FIG. 6. FIG. 6 is a graph showing the relationships between susceptor temperature (° C.) and time (seconds). "Cool on" represents continuous circulation of fluid (gas or liquid; nitrogen gas in this example) throughout the steps, which fluid can be cooled upstream of the inflow line (for example, after circulating through the susceptor, the fluid such as water can flow into a heat exchanger wherein heat is exchanged between the flowing fluid and a coolant circulating through a chiller, and then, the fluid can re-circulate through the susceptor).

As illustrated in FIG. 6, the temperature of the pedestal was recorded throughout the processes. Before a first wafer was loaded to the reactor, the temperature of the susceptor was about 365° C. as it was set at 365° C., nitrogen gas began being supplied without temperature control, i.e., at room temperature, to the inflow line at a flow rate of 40 slm, and the nitrogen gas began circulating through the susceptor and was discharged via the outflow line to the outside without being reused. Upon loading the first wafer in step 1, the temperature of the susceptor went down due to heat transfer from the susceptor to the first wafer. Thereafter, UV irradiation began in step 2, and the temperature of the susceptor rose as the wafer was being irradiated with UV light. In step 2, due to sharp pressure rise from base pressure 0 Pa to set pressure 665 Pa, for example, the susceptor temperature also sharply rose (wherein the cooling effect by the circulating nitrogen gas was limited). After the pressure was stabilized, due to the nitrogen gas circulation in the susceptor, the susceptor temperature substantially stopped rising in step 3 (maintaining at approximately 371.5° C.). When the process with UV irradiation was complete, UV irradiation was stopped whereas the nitrogen gas circulation was continued. Then, the wafer was unloaded from the reactor and the susceptor temperature went down in step 4. After the wafer was unloaded, chamber cleaning began, using a cleaning gas in step 5 with UV irradiation, thereby increasing the susceptor temperature. Thereafter, a second wafer was loaded, and the susceptor temperature decreased in step 6. When the cooling was conducted during the wafer processing, (from step 1 to the end of step 3), the susceptor temperature rose in a small range during UV irradiation, particularly in step 3, then decreased to approximately 365° C. toward the end of step 6 via steps 4 and 5, which was approximately the same as the set temperature before the process of the second wafer started. The second wafer was subjected to the same steps as those for the first wafer. Due to the cooling being conducted throughout all the steps (steps 1 to 6), the susceptor temperature pattern was substantially the same at every wafer-processing. The cooling of the susceptor was effectively and substantially inhibiting increase of the susceptor temperature.

In the same manner as above except that nitrogen gas was not circulated in the inflow line, UV irradiation was conducted and the temperature of the susceptor was recorded throughout the processes.

In FIG. 6, "cool off" represents no cooling. As can be seen from FIG. 6, without circulating nitrogen gas in the flow line as indicated in the line marked with "cool off", as the first wafer was irradiated with UV light, the susceptor temperature continued rising to approximately 376.5° C. in step 3. Further, when the cooling was not conducted ("cool off"), at the end of step 6, the susceptor temperature was still as high as approximately 371.5° C. Furthermore, when the cooling was not conducted ("cool off"), the susceptor temperature at the end of step 3 for the second wafer reached approximately 378.5° C., approximately two degrees higher than that for the first wafer.

As can be seen from FIG. 6, when circulating nitrogen gas with cooling, the temperature of the susceptor can stably be maintained substantially at a UV irradiation set temperature (e.g., 370° C.) during UV irradiation even as the number of wafers to be processed increases, whereas without cooling, the temperature of the susceptor increases with increase of the number of wafers to be processed.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A pedestal for supporting a substrate, comprising:
a heating plate for heating the substrate, said heating plate having a top face and a bottom face opposite to the top face;
an upper cooling plate for cooling the substrate, installed on the top face of the heating plate and provided with an upper fluid path for passing a cooling fluid therethrough; and
a lower cooling plate for cooling the substrate, installed under the bottom face of the heating plate and including a lower fluid path for passing a cooling fluid therethrough,
wherein each of the upper fluid path and the lower fluid path is constituted by a single fluid path,
the upper single fluid path is constituted by an upper fluid inlet port, an upper fluid outlet port disposed in a vicinity of the upper fluid inlet port, a turnaround point, an out-bound path extending from the upper fluid inlet port to the turnaround point, and an in-bound path extending from the turnaround point to the upper fluid outlet port along the out-bound path, wherein the upper single fluid path is closed except for the upper fluid inlet port and the upper fluid outlet port, and
the lower single fluid path is constituted by a lower fluid inlet port, a lower fluid outlet port in a vicinity of the lower fluid inlet port, a turnaround point, an out-bound path extending from the lower fluid inlet port to the turnaround point, and an in-bound path extending from the turnaround point to the lower fluid outlet port along the out-bound path, wherein the lower single fluid path is closed except for the lower fluid inlet port and the lower fluid outlet port,
wherein the upper single fluid path and the lower single fluid path are fluid-communicated with each other via the upper and lower fluid inlet ports fluid-communicated with each other, and via the upper and lower outlet ports fluid-communicated with each other, so that a same fluid can pass through the upper and lower single fluid paths in parallel.

2. The pedestal according to claim 1, wherein
the out-bound path and the in-bound path of the upper single fluid path are disposed substantially in parallel with each other as viewed from above, and
the out-bound path and the in-bound path of the lower single fluid path are disposed substantially in parallel with each other as viewed from above.

3. The pedestal according to claim 1, wherein
the out-bound path and the in-bound path of the upper single fluid path wind spirally in a first direction around the center of the upper cooling plate as viewed from above, and
the out-bound path and the in-bound path of the lower single fluid path wind spirally in a second direction opposite to the first direction around the center of the lower cooling plate as viewed from above.

4. The pedestal according to claim 3, wherein
the out-bound path and the in-bound path of the upper single fluid path wind spirally in the first direction at least one time around the center of the upper cooling plate as viewed from above, and the out-bound path and the in-bound path of the lower single fluid path wind spirally in the second direction at least one time around the center of the lower cooling plate as viewed from above.

5. The pedestal according to claim 3, wherein the upper single fluid path and the lower single fluid path have substantially the same length and are arranged substantially in reflection symmetry.

6. The pedestal according to claim 1, wherein the upper fluid inlet and outlet ports are located in a vicinity of the center of the upper cooling plate, and the lower fluid inlet and outlet ports are located in a vicinity of the center of the lower cooling plate.

7. The pedestal according to claim 1, wherein the upper cooling plate, the heating plate, and the lower cooling plate are made of a metal and are soldered using a solder.

8. The pedestal according to claim 7, wherein
the upper cooling plate is constituted by a metal plate with a patterned recess, and the upper fluid path is constituted by the patterned recess and a top surface of the heating plate; and
the lower cooling plate includes a bottom cap and is constituted by a metal plate with a patterned recess, and the lower fluid path is constituted by the patterned recess and a top surface of the bottom cap attached to a bottom of the metal plate.

9. The pedestal according to claim 7, wherein the upper cooling plate, the heating plate, and the lower cooling plate are made of aluminum.

10. The pedestal according to claim 1, wherein the upper cooling plate has a top surface for supporting the substrate thereon.

11. The pedestal according to claim 1, wherein the upper cooling plate, the heating plate, and the lower cooling plate have through holes for lift pins slidable along the through holes for lifting the substrate.

12. The pedestal according to claim 1, wherein the upper fluid path and the lower fluid path are connected to a fluid supply line which supplies the cooling fluid which is a gas or gases selected from the group consisting of air, $N_2$, He, and Ar.

13. The pedestal according to claim 1, wherein the upper fluid path and the lower fluid path are connected to a fluid supply line which supplies the cooling fluid which is a liquid or liquids selected from the group consisting of water, ethylene glycol, and fluorocarbon.

14. The pedestal according to claim 1, which is adapted to be installed in a UV irradiation apparatus.

15. The pedestal according to claim 1, which is adapted to be installed in a CVD or ALD apparatus.

16. A UV irradiation apparatus comprising a UV irradiation chamber in which the pedestal of claim 1 is installed for supporting a substrate.

17. A CVD or ALD apparatus comprising a CVD or ALD reaction chamber in which the pedestal of claim 1 is installed for supporting a substrate.

* * * * *